United States Patent
Kang et al.

(10) Patent No.: US 11,898,916 B2
(45) Date of Patent: *Feb. 13, 2024

(54) DEVICE FOR TEMPERATURE MONITORING OF A SEMICONDUCTOR DEVICE

(71) Applicant: TAIWAN SEMICONDUCTOR MANUFACTURING COMPANY, LTD., Hsinchu (TW)

(72) Inventors: Po-Zeng Kang, Hsinchu (TW); Wen-Shen Chou, Hsinchu (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 94 days.

This patent is subject to a terminal disclaimer.

(21) Appl. No.: 17/534,436

(22) Filed: Nov. 23, 2021

(65) Prior Publication Data

US 2022/0082451 A1  Mar. 17, 2022

Related U.S. Application Data

(62) Division of application No. 16/656,446, filed on Oct. 17, 2019, now Pat. No. 11,215,513.

(51) Int. Cl.
*G01K 7/01* (2006.01)
*H01L 23/522* (2006.01)
(Continued)

(52) U.S. Cl.
CPC .......... *G01K 7/015* (2013.01); *H01L 23/5226* (2013.01); *H01L 27/0924* (2013.01); *H01L 29/785* (2013.01)

(58) Field of Classification Search
CPC .............. H01L 27/0924; H01L 29/785; H01L 2924/13067; H01L 21/823431;
(Continued)

(56) References Cited

U.S. PATENT DOCUMENTS 9,536,876 B2 * 1/2017 Peng ................... H01L 27/0251
9,620,607 B2   4/2017 Huang et al.
(Continued)

FOREIGN PATENT DOCUMENTS

JP    2017069419 A * 4/2017 ......... G01R 31/2621
TW    200731441      8/2007

OTHER PUBLICATIONS

Semiconductor Components Industries, LLC, 2012 Published document, "Low Cost Microprocessor System Temperature Monitor Microcomputer", Publication Order No. ADM1021A/D, Jul. 2012—Rev. 9., ON Semiconductor Website: www.onsemi.com; total 16 pages.

(Continued)

*Primary Examiner* — Suberr L Chi
(74) *Attorney, Agent, or Firm* — Hauptman Ham, LLP

(57) ABSTRACT

A semiconductor device includes a plurality of active area structures. One or more active devices include portions of the plurality of active area structures. A metal layer is formed on the plurality of active area structures and separated from the one or more active devices by one or more dummy gate layers. The metal layer is configured to measure, due to a change of resistance in the metal layer, a temperature of the plurality of active area structures.

20 Claims, 8 Drawing Sheets

(51) Int. Cl.
*H01L 27/092* (2006.01)
*H01L 29/78* (2006.01)

(58) Field of Classification Search
CPC .......... H01L 21/823821; H01L 21/845; H01L 27/0886; H01L 27/10826; H01L 27/10879; H01L 27/1211; H01L 29/41791; H01L 29/66795; H01L 29/66545; H01L 29/6681; H01L 2224/03011; H01L 23/5226; G01K 7/015
See application file for complete search history.

(56) References Cited

U.S. PATENT DOCUMENTS

| | | | |
|---|---|---|---|
| 10,078,108 B2* | 9/2018 | Li | H01L 21/823814 |
| 11,215,513 B2* | 1/2022 | Kang | H01L 23/34 |
| 2015/0098489 A1* | 4/2015 | Lee | B82Y 40/00 |
| | | | 374/178 |
| 2015/0362539 A1 | 12/2015 | Chou et al. | |
| 2019/0204955 A1 | 7/2019 | Haga et al. | |
| 2019/0288084 A1* | 9/2019 | Wang | H01L 21/32137 |

OTHER PUBLICATIONS

Duarte et al., "Temperature Sensor Design in a High Volume Manufacturing 65nm CMOS Digital Process", IEEE 2007 Custom Integrated Circuits Conference (CICC), 1-4244-1623-X/2007; pp. 221-224.

Oshita et al., "Compact BJT-Based Thermal Sensor for Processor Applications in a 14 nm tri-Gate CMOS Process", IEEE Journal of Solid-State Circuits, vol. 50, No. 3, Mar. 2015; pp. 799-807.

Mautry et al., "Investigation of Self-Heating in VLSI and ULSI MOSFETS", Proc. IEEE 1990 Int. Conference on Microelectronic Test Structures, vol. 3, Mar. 1990; pp. 221-226.

Su et al., "Measurement and Modeling of Self-Heating in SO1 NMOSFET'S", IEEE Transactions on Electron Devices, vol. 41, No. 1, Jan. 1994; pp. 69-75.

* cited by examiner

DEVICE FOR TEMPERATURE MONITORING OF A SEMICONDUCTOR DEVICE

PRIORITY CLAIM

The present application is a divisional of U.S. application Ser. No. 16/656,446, filed Oct. 17, 2019, now U.S. Pat. No. 11,215,513, issued Jan. 4, 2022, which is incorporated herein by reference in its entirety.

BACKGROUND

One approach for monitoring temperature of a semiconductor device includes using a junction of a diode or a bipolar junction transistor (BJT) in a region of a substrate near a transistor structure under test. Another approach used for monitoring temperature of a semiconductor device includes using a gate of a transistor structure for sensing temperature.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
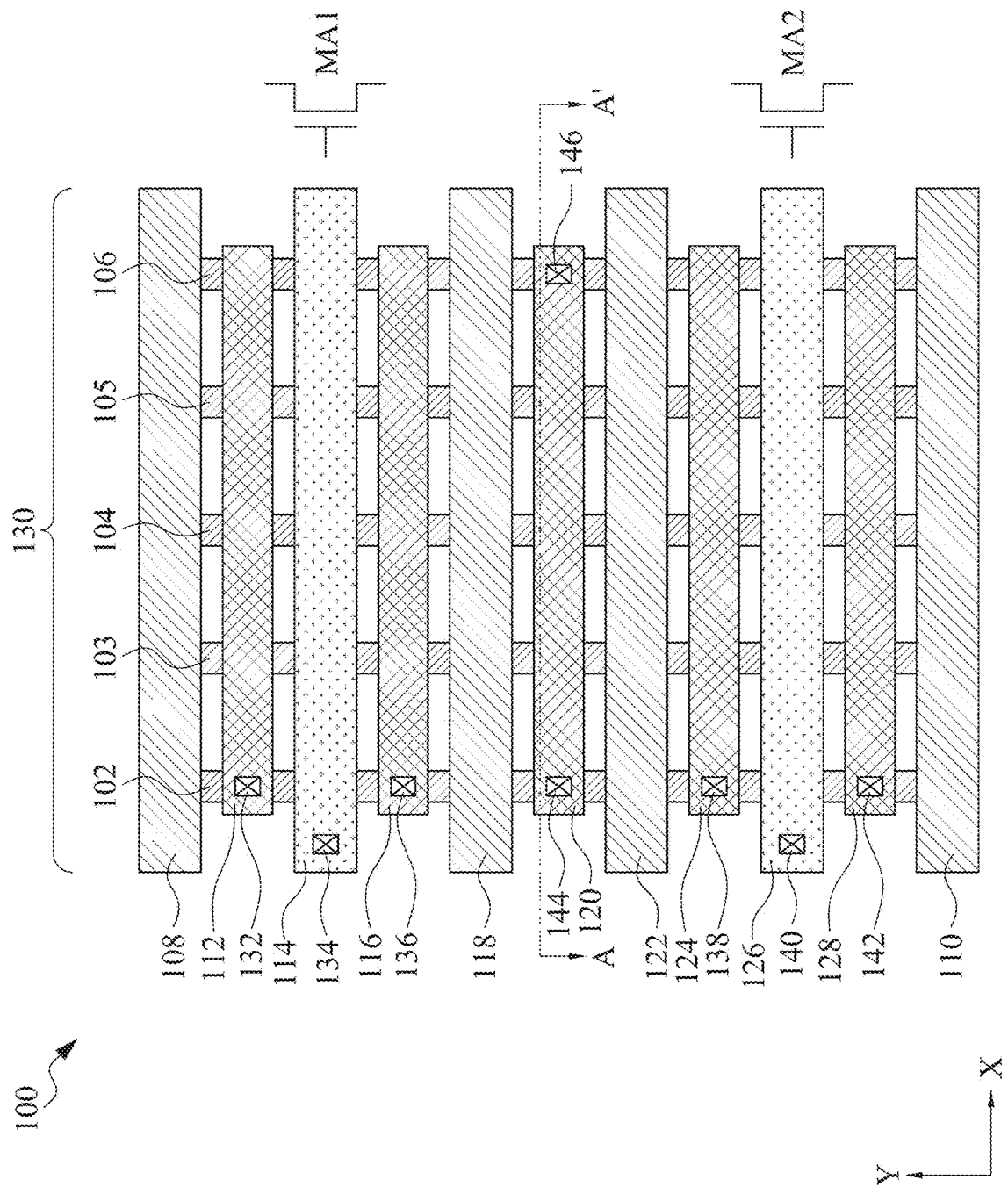
FIG. 1A is a schematic diagram of a semiconductor device that uses a sense metal resistor to measure temperature, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more embodiments of the present disclosure include approaches for on-chip temperature measurement/monitoring of three dimensional (3D) active devices, such as 3D metal oxide semiconductor field effect transistors (MOSFETs), fin field-effect transistors (FinFETs), gate-all-around (GAA) FETs, or the like. One approach for on-chip temperature measurement/monitoring includes a source metal resistor to detect the temperature of a 3D active device. Another approach utilizes a double polysilicon gate arrangement or cascode configuration to detect the temperature of 3D active devices.

Figure 1C:
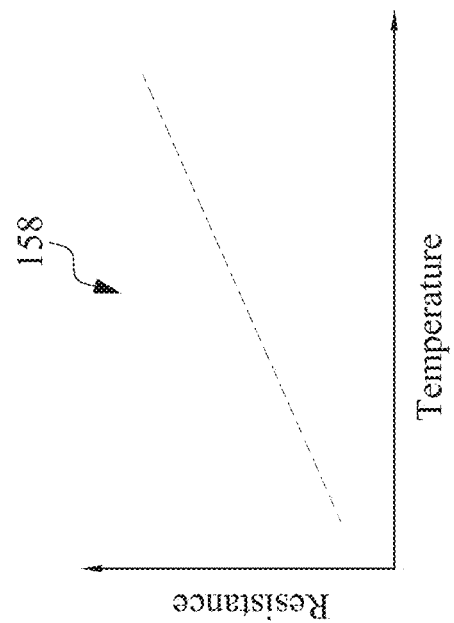
FIG. 1C is a graph of a relationship between temperature and resistance of the sense metal resistor, in accordance with some embodiments.
Figure 1B:
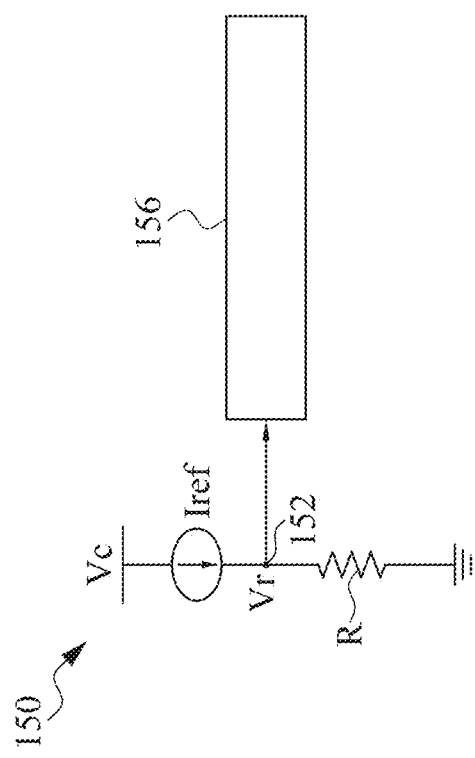
FIG. 1B is schematic diagram of an equivalent circuit of the semiconductor device of FIG. 1A, in accordance with some embodiments.

FIG. 1A is a schematic diagram of a semiconductor device 100 usable for measuring temperature of active devices, in accordance with some embodiments. In at least some embodiments, the semiconductor device 100 is used to measure temperatures of 3D active devices. In accordance with various embodiments, FIG. 1B is schematic diagram of an equivalent circuit of the semiconductor device 100, FIG. 1C is a graph of a relationship between temperature and resistance of a sense metal resistor 120 of the semiconductor device 100, and FIGS. 1D and 1E are schematic diagrams of cross-sections of the semiconductor device 100 along line A-A' of FIG. 1A.

The semiconductor device 100 includes active area structures 102, 103, 104, 105, and 106 arranged in substantially parallel columns extending in a first direction (Y axis), and a plurality of gate layers 108, 110, 114, 118, 122, and 126 arranged in substantially parallel rows and extending in a second direction (X axis) substantially perpendicular to the first direction.

Figure 1D:
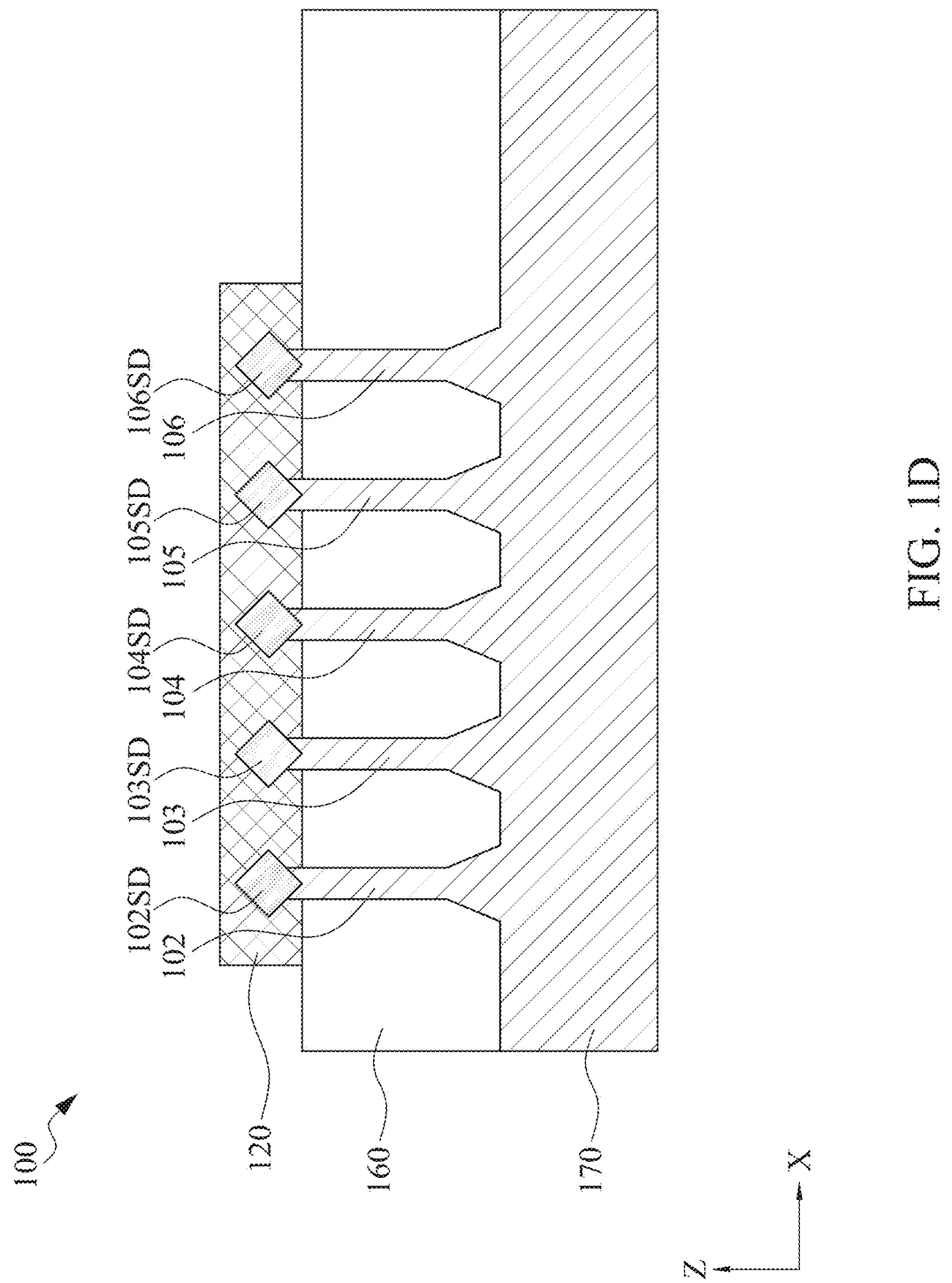
FIGS. 1D and 1E are schematic diagrams of cross-sections of the semiconductor device of FIG. 1A, in accordance with some embodiments.
Figure 1E:
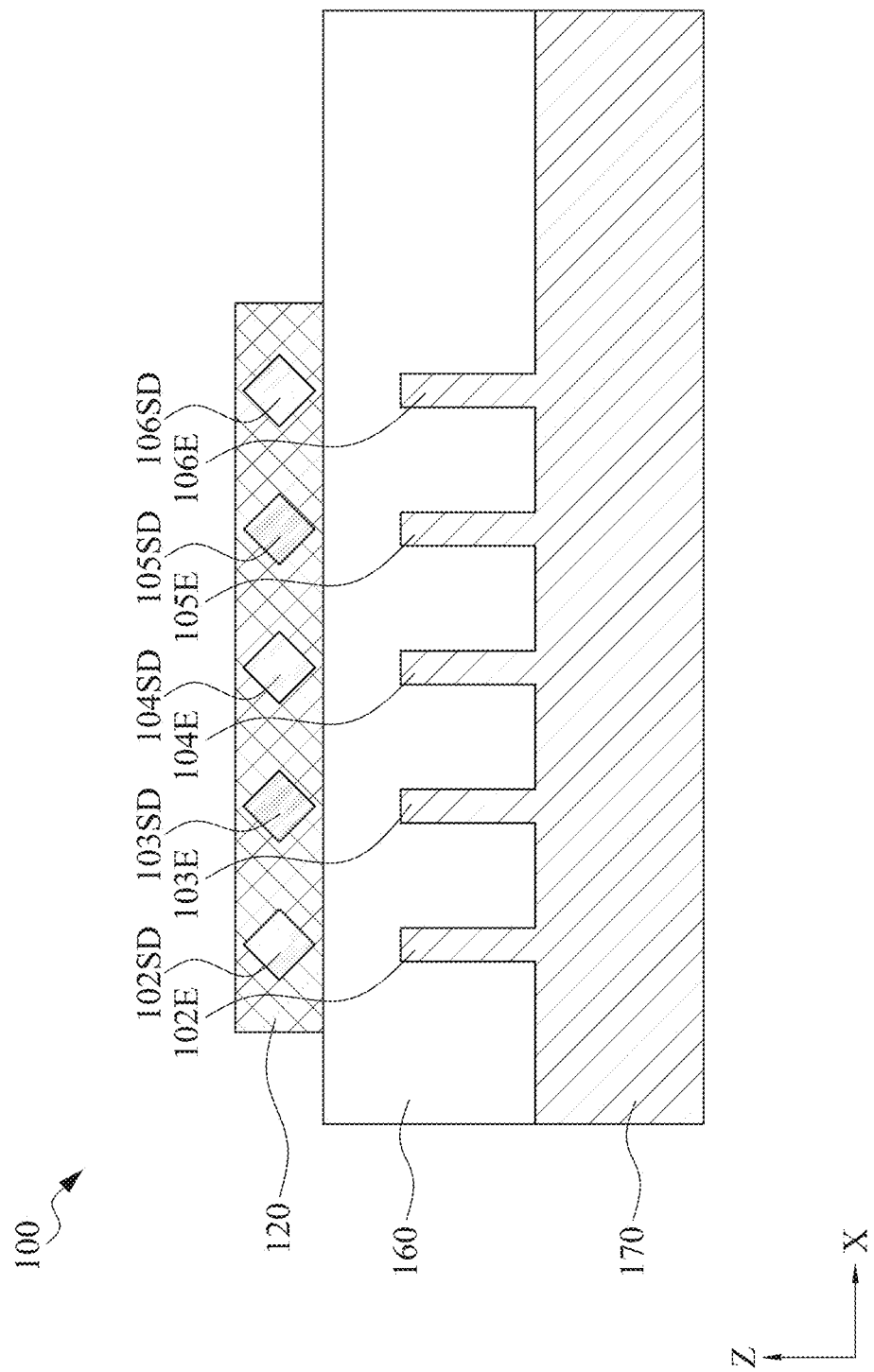

Active area structures 102-106 are continuous sections in or on a substrate, e.g., a substrate 170 depicted in FIGS. 1D and 1E, having either n-type or p-type doping and include various semiconductor structures, including source-drain (S/D) structures, e.g., S/D structures 102SD-106SD depicted in FIGS. 1D and 1E. In some embodiments, active area structures 102-106 are located within a well (not shown), i.e., either an n-well or a p-well, within the substrate.

In some embodiments, active area structures 102-106 are electrically isolated from other elements in the substrate by one or more isolation structures (not shown), e.g., one or more shallow trench isolation (STI) structures.

The S/D structures are semiconductor structures configured to have a doping type opposite to that of other portions of active area structures 102-106. In some embodiments, the S/D structures are configured to have lower resistivity than other portions of active area structures 102-106. In some embodiments, the S/D structures include one or more portions having doping concentrations greater than one or more doping concentrations otherwise present throughout active area structures 102-106. In various embodiments, the S/D structures include epitaxial regions of a semiconductor material, e.g., silicon, silicon-germanium (SiGe), and/or silicon-carbide (SiC).

Each gate layer includes a conductive material, e.g., metal or polysilicon, overlies each of active area structures 102-106, at least partially surrounds each of active area structures 102-106 in some embodiments, and is electrically isolated from each of active area structures 102-106 by one or more dielectric layers. The plurality of gate layers are thereby configured as gate structure components capable of controlling conductive channels in the underlying active area structures 102-106 based on applied voltages. The plurality of gate layers includes dummy gate layers 108, 110, 118, and 122, and active gate layers 114 and 126.

The active area structures 102-106 extend at least between a first dummy gate layer 108 and a second dummy gate layer 110, and include source/drain (S/D) structures (not shown in FIG. 1A) adjacent to some or all of the plurality of gate layers, further discussed below with respect to FIGS. 1D and 1E. A first source metal layer 112 overlies and contacts S/D structures of the active area structures 102-106 and extends in the second direction. The first source metal layer 112 is between the first dummy gate layer 108 and a first active gate layer 114. A first drain metal layer 116 overlies and contacts S/D structures of the active area structures 102-106 and extends in the second direction substantially parallel with the first dummy gate layer 108. The first drain metal layer 116 is between the first active gate layer 114 and a third dummy gate layer 118. The first source metal layer 112, first active gate layer 114, first drain metal layer 116, the channel portions of each of active area structures 102-106 underlying the first active gate layer 114, and the adjacent S/D structures are thereby configured to form a first active device MA1.

Sense metal resistor 120 overlies and contacts S/D structures of the active area structures 102-106 between the third dummy gate layer 118 and a fourth dummy gate layer 122. The sense metal resistor 120 extends in the second direction (X) substantially parallel with the first dummy gate layer 108.

A second source metal layer 124 overlies and contacts S/D structures of the active area structures 102-106 between the fourth dummy gate layer 122 and a second active gate layer 126. The second source metal layer 124 extends in the second direction (X) and substantially parallel with the first dummy gate layer 108. A second drain metal layer 128 overlies and contacts S/D structures of the active area structures 102-106 between the second active gate layer 126 and the second dummy gate layer 110. The second drain metal layer 128 extends in the second direction (X) and substantially parallel with the first dummy gate layer 108. The second source metal layer 124, second active gate layer 126, second drain metal layer 128, the channel portions of each of active area structures 102-106 underlying the second active gate layer 126, and the adjacent S/D structures are thereby configured to form to a second active device MA2.

The active area structures 102-106 are thereby arranged as an active area structure lane 130 including the first active device MA1 and the second active device MA2. Because the active area structures 102-106 have a high thermal conductivity relative to that of surrounding dielectric layers (not shown), temperatures of the active area structures 102-106 beneath the active gate layers 114 and 126, drain metal layers 116 and 128, source metal layers 112 and 124, and the sense metal resistor 120, and of the sense metal resistor itself, are substantially the same.

Vias 132, 134, and 136 electrically connect the first source metal layer 112, the first active gate layer 114, and the first drain metal layer 116 to respective overlying metal segments (not shown), e.g., first metal layer one segments, active device MA1 thereby being configured to be included in an integrated circuit (IC). Vias 138, 140, and 142 electrically connect the second source metal layer 124, the second active gate layer 126, and the second drain metal layer 128 to respective overlying metal segments (not shown), e.g., first metal layer segments, active device MA2 thereby being configured to be included in the IC.

Vias 144 and 146 electrically connect opposite ends of the sense metal resistor 120 to overlying metal segments (not shown), e.g., first metal layer segments, the sense metal resistor 120 thereby being configured to be included in a test circuit arrangement such that a resistance value of the sense metal resistor 120 is capable of being measured, as discussed below.

In operation, the third dummy gate layer 118 and the fourth dummy gate layer 122 electrically isolate the sense metal resistor 120 from the first active device MA1 and the second active device MA2 during resistance measurements. The electrical isolation between the sense metal resistor 120, the first active device MA1, and the second active device MA2, enables accurate resistance measurements to be made by substantially preventing current flow from the first active device MA1 and the second active device MA2 from affecting results measured at the sense metal resistor 120 through vias 144 and 146.

In a measurement operation, the vias 144 and 146 are electrically coupled to one or more measurement instruments (not shown), a voltage drop is generated across the sense metal resistor 120 based on a current applied through the sense metal resistor 120, and a resistance value of the sense metal resistor 120 is calculated. In some embodiments, the resistance of the sense metal resistor 120 has a linear relationship with temperature, and a temperature of the active area structures 102-106 distributed across the active area structure lane 130 is determined by finding the resistance of the sense metal resistor 120.

In some embodiments, the active area structures 102-106 are configured for PMOS technologies, NMOS technologies, CMOS technologies, FinFET technologies, or the like.

In some embodiments, the sense metal resistor 120 includes resistive metal materials, such as nichrome or carbon. In some embodiments, the sense metal resistor 120 is a metal oxide film. In some embodiments, the sense metal resistor 120 includes copper (Cu).

In some embodiments, the vias 132, 134, 136, 138, 140, 142, 144, and 146 correspond to holes etched in an interlayer dielectric that are filled with one or more metals. In various embodiments, the vias 132, 134, 136, 138, 140, 142, 144, and 146 are similar or different forms of via structures relative to each other.

FIG. 1B is a schematic diagram of a circuit model 150 of the semiconductor device 100, in accordance with some embodiments. The circuit model 150 includes a current source Iref in series with a resistor R. The current source Iref is connected between a power voltage source Vc and a node 152. The resistor R is connected between the node 152 and ground. A voltage Vr is the voltage drop across the resistor R. The current source Iref corresponds to a current applied to sense metal resistor 120. The voltage Vr corresponds to a voltage across the sense metal resistor 120. The resistor R is the resistance measured for the sense metal resistor 120. A readout circuit 156 is connected to node 152 and measures the voltage Vr at the node 152. The equation (1):

$$R = Vr/Iref \qquad \text{equation (1)}$$

is used to calculate the resistance value of the sense metal resistor 120.

FIG. 1C includes a graph 158 of the linear relationship between the resistance R and temperature of the sense metal resistor 120. Graph 158 includes a temperature axis (X axis) and a resistance axis (Y axis). After calculating the resistance R using equation (1) above, the temperature of the sense metal resistor 120 is determined based on the relationship between resistance R and temperature of the sense metal resistor, e.g., the linear relationship of graph 158. Different materials have different temperatures corresponding to particular resistance values. The temperature at different resistances are calculable using standard tools, such as MATLAB or the like.

The readout circuit 156 measures the voltage Vr at the node 152. In some embodiments, readout circuit 156 displays the measured voltage. In some embodiments, the readout circuit 156 displays only the resistance value R. In some embodiments, the readout circuit 156 displays only the value of the temperature based on the calculated resistance value. In some embodiments, the readout circuit 156 includes an analog to digital converter (ADC) that allows the readout circuit 156 to convert the analog reading of the voltage Vr to digital for operation with other digital systems. In some embodiments, the readout circuit 156 includes an amplifier arrangement, such as an operational amplifier, to amplify the voltage Vr for detection and measurement.

In the non-limiting example depicted in the cross-section of FIG. 1D, semiconductor device 100 corresponds to a FinFET technology in which active area structures 102-106 are configured as fin structures separated from each other by a dielectric layer 160 and extending upward from underlying substrate 170. Active area structures 102-106 include respective S/D structures 102SD-106SD in contact with and electrically connected to the sense metal resistor 120.

In the non-limiting example depicted in the cross-section of FIG. 1E, semiconductor device 100 corresponds to a GAA technology in which the S/D structures 102SD-106SD are the only portions of the active area structures 102-106 in the cross-sectional plane. S/D structures 102SD-106SD are in contact with and electrically connected to the sense metal resistor 120 and are separated from extended portions 102E-106E of substrate 170 by dielectric layer 160. The extended portions 102E-106E correspond to a manufacturing method by which active area structures 102-106 are formed and are not active components of semiconductor device 100.

In each of the non-limiting examples of FIGS. 1D and 1E, channel regions (not shown) of the active area structures 102-106 are adjacent to the S/D structures 102SD-106SD that are in contact with the sense metal resistor 120. In various embodiments, semiconductor device 100 includes configurations other than those depicted in FIGS. 1D and 1E whereby the sense metal resistor 120 is in contact with S/D structures adjacent to channel regions of active area structures 102-106.

Because the sense metal resistor 120 is in contact with S/D structures 102SD-106SD adjacent to channel regions of active area structures 102-106, a temperature of the sense metal resistor 120 is substantially the same as a temperature of the channel regions. Accordingly, a temperature value calculated from a resistance measurement of sense metal resistor 120 is more accurate than temperature values obtained through approaches that are not based on resistance measurements of a sense metal resistor, e.g., approaches based on substrate diode characteristics.

Figure 2A:
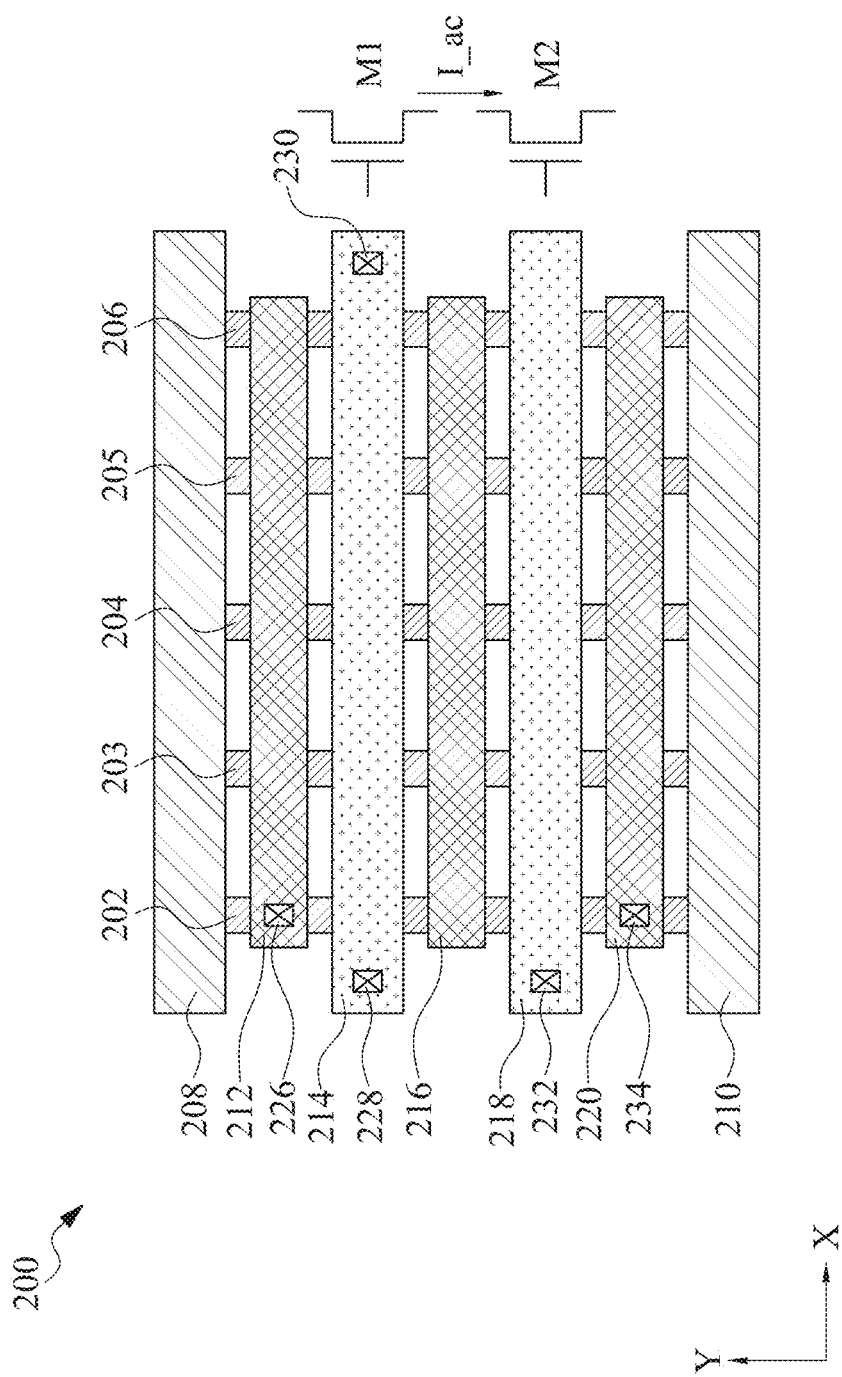
FIGS. 2A-2B are schematic diagrams of a semiconductor device using a sense gate to measure temperature, in accordance with some embodiments.

FIG. 2A is a schematic diagram of a semiconductor device 200 having a double gate layer arrangement as part of a cascode transistor configuration usable to measure the temperature of 3D active devices in accordance with some embodiments. The semiconductor device 200 includes active area structures 202, 203, 204, 205, and 206 arranged substantially in parallel in columns and extending in a first direction (Y). The active area structures 202, 203, 204, 205, and 206 extend between a first gate layer 208 and a second dummy gate layer 210. The first dummy gate layer 208 and the second dummy gate layer 210 are arranged substantially in parallel in rows and extend in a second direction (X) substantially perpendicular to the first direction (Y). A drain metal layer 212 is formed on the active area structures 202, 203, 204, 205, and 206 and extends in the second direction (X). The drain metal layer 212 is positioned between the first dummy gate layer 208 and a sense gate layer 214. The sense gate layer 214 extends in the second direction and is substantially parallel to the first dummy gate layer 208. A first metal layer 216 is formed on the active area structures 202, 203, 204, 205, and 206 and extends in the second direction and substantially parallel to the first dummy gate layer 208. The first metal layer 216 is positioned between the sense gate layer 214 and a switching gate layer 218. The switching gate layer 218 extends in the second direction and substantially parallel to the first dummy gate layer 208. The first metal layer 216, the sense gate layer 214, the drain metal layer 212, the channel portions of each of active area structures 202-206 underlying the sense gate layer 214, and adjacent S/D structures (not shown) in active area structures 202-206 are thereby configured to form a first active device M1.

A source metal layer 220 is formed on the active area structures 202, 203, 204, 205, and 206 and extends in the second direction and substantially parallel to the first dummy gate layer 208. The source metal layer 220 is positioned between the switching gate layer 218 and the second dummy gate layer 210. The source metal layer 220, the switching gate layer 218, the first metal layer 216, the channel portions of each of active area structures 202-206 underlying the switching gate layer 218, and adjacent S/D structures (not shown) in active area structures 202-206 are thereby configured to form a second active device M2. The first metal layer 216 is configured to operate as a source for the first active device M1 and a drain for the second active device M2, active devices M1 and M2 thereby being arranged in a cascode configuration. The first metal layer 216 couples the source of the first active device M1 to the drain of the second active device M2. Also, the first metal layer 216 allows for a current to flow between the source of the first active device M1 and the drain of the second active device M2.

Vias 226, 228, 230, 232, and 234 electrically connect the first active device M1 and the second active device M2 to overlying metal segments (not shown), e.g., first metal layer segments, the active devices M1 and M2 thereby being configured to be included in a test circuit arrangement.

Vias 228 and 230 located at opposite ends of the sense gate layer 214 of the first active device M1 enable resistance of the sense gate layer 218 to be measured in a measurement operation. Because of the proximity of the sense gate layer 214 to the channel regions of the active area structures 202, 203, 204, 205, and 206, temperature measurements of the sense gate layer 214 are indicative of the channel region temperatures.

In a measurement operation, the second active device M2 is configured to receive an AC signal and thereby operate as a switch under an AC operation. The second active device M2 is coupled to an AC signal source configured such that the AC operation emulates an operation of one or more active devices of an IC circuit. In some embodiments, the second active device M2 is ON when the AC signal of the AC signal source is positive and OFF when the AC signal is negative. In the cascode configuration discussed above, the first active device M1 operates in the saturation region with a high output resistance. The second active device M2 operates in the linear region having a low output resistance. As depicted in FIG. 2A, the first active device M1 and the second active device M2 are serially connected, via the first metal layer 216, where an AC current I_ac flows through the source of the first active device M1 and the drain of the second active device M2 when the second active device is ON. Most of the power is consumed in the first active device M1 because the channel resistance of the first active device M1 is substantially larger than the channel resistance of the second active device M2 based on the cascode configuration.

The channel resistance of the sense gate layer 214 is linearly proportional to the temperature of the channel regions of the active area structures 202, 203, 204, 205, and 206 beneath the sense gate layer 214. Once the resistance of the sense gate layer 214 is computed, the temperature of the channel regions of the active area structures 202, 203, 204, 205, and 206 is determined using the linear relationship.

In operation, in some embodiments, the resistance of the sense gate layer 214 of the first active device M1 is measured by applying the AC signal to the switching gate layer 218 while biasing the sense gate layer 214 with a DC voltage above the threshold voltage of the first active device M1, thereby switching the first active device M1 ON. While current I_ac is thereby induced through the cascode configuration, a test current is applied and voltage drop measured across the sense gate layer 214 through vias 228 and 230. The value of the resistance of the sense gate layer 214 is computed using the measured voltage drop across the sense gate layer 214 and the test current. Using the value of the resistance of the sense gate layer 214, the temperature of the channel regions of the active area structures 202, 203, 204, 205, and 206 is determined using the linear relationship between the resistance of gate layers and temperature discussed herein. Because the first active device M1 thereby operates in the saturation region in response to the AC signal, the determined temperature corresponds to a temperature of the one or more active devices of the IC circuit being emulated by the AC signal.

The via 232 of the switching gate layer 218 is configured to allow toggling of the second active device M2 either under AC operation or in response to a step function. In operation, in some embodiments, an AC or step signal is applied to the gate of the second active device M2 for toggling, so the second active device M2 is either turned ON or OFF for testing depending on the value of the AC or step signal. Using this approach, transient temperature values are capable of being measured either under the AC operation or in response to the step signal. In some embodiments, the gate of the second active device M2 is always turned ON for testing under DC operating conditions.

In some embodiments, the semiconductor device 200 allows for other active devices or repeated structures to be formed on the active area structures 202-206 based on the first dummy gate layer 208 and the second dummy gate layer 210. The first dummy gate layer 208 and the second dummy gate layer 210 provide sufficient electrical separation if new active devices are formed on the active area structures 202-206.

In various embodiments, the first active device M1 and the second active device M2 are configured for PMOS technologies, NMOS technologies, CMOS technologies, FinFET technologies, or the like.

In some embodiments, the vias 226, 228, 230, 232, 234, and 236 correspond to holes etched in an interlayer dielectric that are filled with one or more metals. In various embodiments, the vias 226, 228, 230, 232, 234, and 236 are similar or different forms of via structures from each other.

Figure 2B:
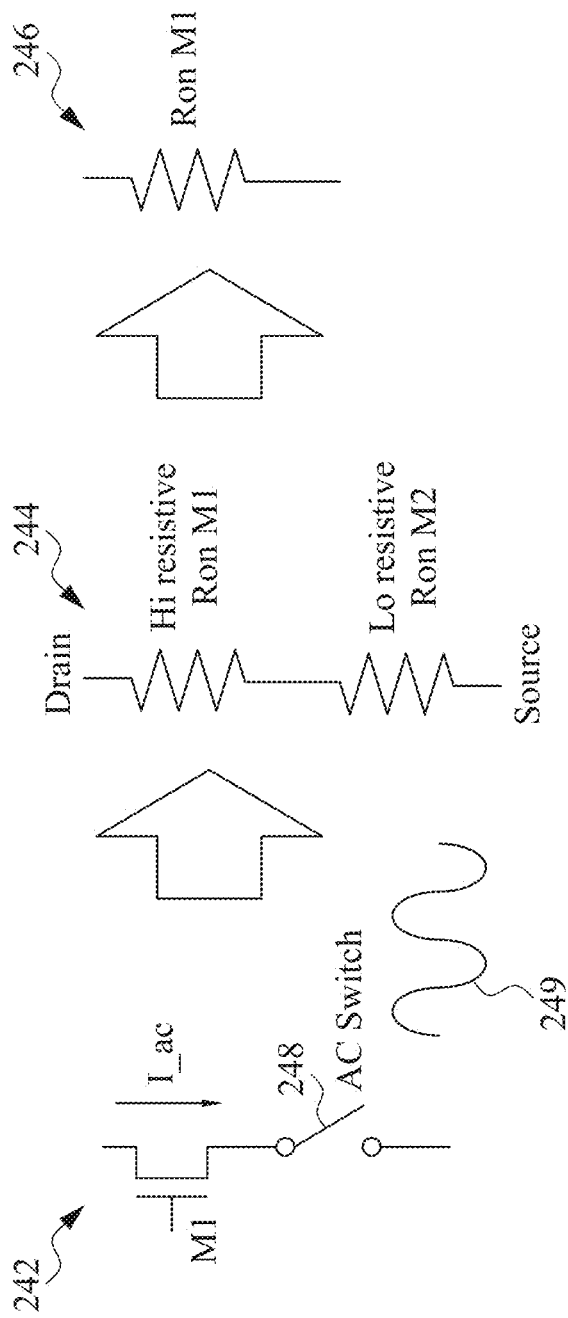

FIG. 2B is a schematic diagram of equivalent circuits 242, 244, and 246 of the semiconductor device 200, in accordance with some embodiments. FIG. 2B includes the first equivalent circuit 242 of the semiconductor device 200. The equivalent circuit 242 includes the first active device M1 coupled to an AC switch 248 indicative of the second active device M2 under an AC operation. As discussed herein, the switching gate layer 218 of the second active device M2 is toggled ON and OFF indicative of the switch 248 using an AC signal 249 under AC operation.

Second equivalent circuit 244 models when the first active device M1 operates in the saturation region and the second active device M2 operates in the linear region when the AC switch 248 is ON. The second equivalent circuit 244 includes a resistor Ron M1 that corresponds to the output channel resistance of the first active device M1 in the saturation region. The resistor Ron M1 is coupled between the drain of the first active device M1 and a second resistor Ron M2 that corresponds to the output channel resistance of the second active device M2 in the linear region. Based on the cascode arrangement, the resistor Ron M1 is larger than the resistor Ron M2. In some embodiments, dimensions of the first active device M1 match those of one or more active devices being emulated by the semiconductor device 200, resistor Ron M1 thereby matching the output channel resistance of the one or more active devices The third equivalent circuit 246 models the semiconductor device 200 as the resistor Ron M1 because Ron M1>>Ron M2 based on the cascode arrangement of the semiconductor device 200.

In some embodiments, a readout circuit measures the voltage across the sense gate layer 214 and displays the results. In some embodiments, the readout circuit is a readout circuit as described in connection with FIG. 1B. In some embodiments, a readout circuit is programmed to display only the value of the temperature based on the calculated value of the resistance of the sense gate layer 214. In some embodiments, a readout circuit includes an analog to digital converter (ADC) to measure the voltage across the sense gate layer 214. In some embodiments, a readout circuit includes an opAmp arrangement to measure the voltage across the sense gate layer 214.

Figure 3:
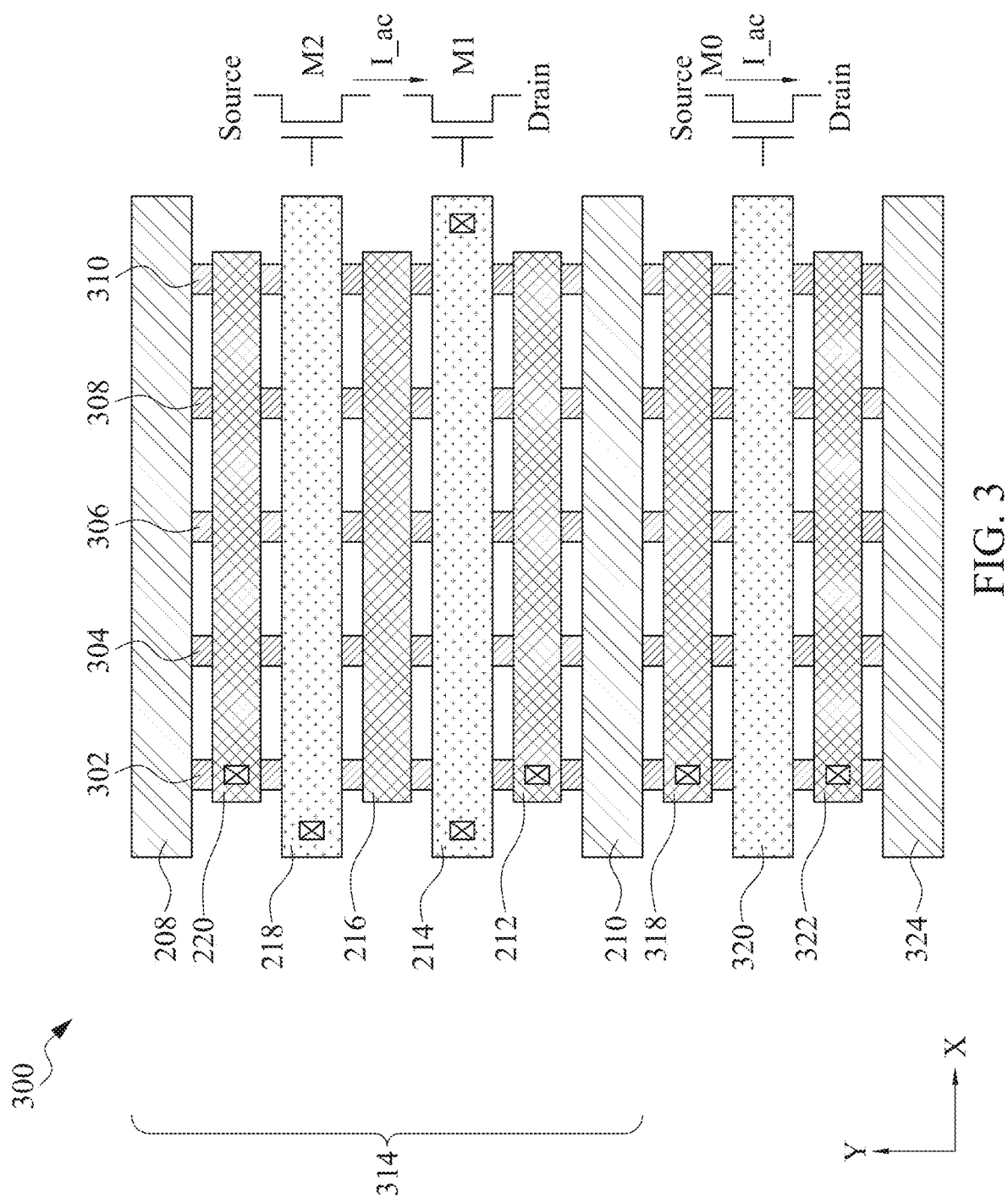
FIG. 3 is a schematic diagram of a semiconductor device for measuring transient temperature change, in accordance with some embodiments.

FIG. 3 is a schematic diagram of a semiconductor device 300 usable for measuring temperature under AC or transient operation, in accordance with some embodiments. The semiconductor device 300 includes active area structures 302, 304, 306, 308, and 310 arranged substantially in parallel in columns and extending in a first direction (Y). The semiconductor device 300 includes a temperature monitor device 314 and an active device M0 that are each disposed on the active area structures 302, 304, 306, 308, and 310. The temperature monitor device 314 is equivalent to the semiconductor device 200 discussed above with respect to FIG. 2A inverted with respect to the first direction (Y). An active device M0 includes a source metal layer 318 between the second dummy gate layer 210 of the temperature monitor device 314 and an active gate layer 320. A drain metal layer 322 is between the active gate layer 320 and a third dummy gate layer 324.

As discussed above with respect to the semiconductor device 200, the temperature monitor device 314 is configured to be usable for measuring the temperature of the channel regions of active area structures 302, 304, 306, 308, and 310 underlying the sense gate layer 214 under transient and/or AC operating conditions. In operation, based on the cascode arrangement of the temperature monitor device 314 and the active devices M0 and M1 having matching configurations, by switching the active device M2 ON and applying a same AC and/or transient signal to both the active gate layer 320 of the active device M0 and the switching gate layer 218 of the second active device M1, a same current I_ac is induced in each of the active devices M0 and M2. Accordingly, a same temperature is produced in each of the channel regions of active area structures 302, 304, 306, 308, and 310 corresponding to the active devices M0 and M2, and a temperature determined from measuring the sense gate layer 214 corresponds to a temperature of the active device M0.

In some embodiments, in operation, all active devices in the semiconductor device 300 are not operational, and the temperature monitor device 314 is used to measure the temperature of the substrate.

The dummy gate layers 208, 210, and 324 provide electrical isolation between the temperature monitor device 314 and other active devices including the active device M0. In some embodiments, there are a number of active devices (not shown) in addition to active device M0 sharing the active area structures 302-310 with the temperature monitor device 314, and one or more dummy gate layers (not shown) in addition to dummy gate layers 208, 210, and 324 electrically isolate the additional active devices from temperature monitor device 314.

In various embodiments, the active device M0 is configured for PMOS technologies, NMOS technologies, CMOS technologies, GAA FET technologies, FinFET technologies, or the like.

Figure 4:
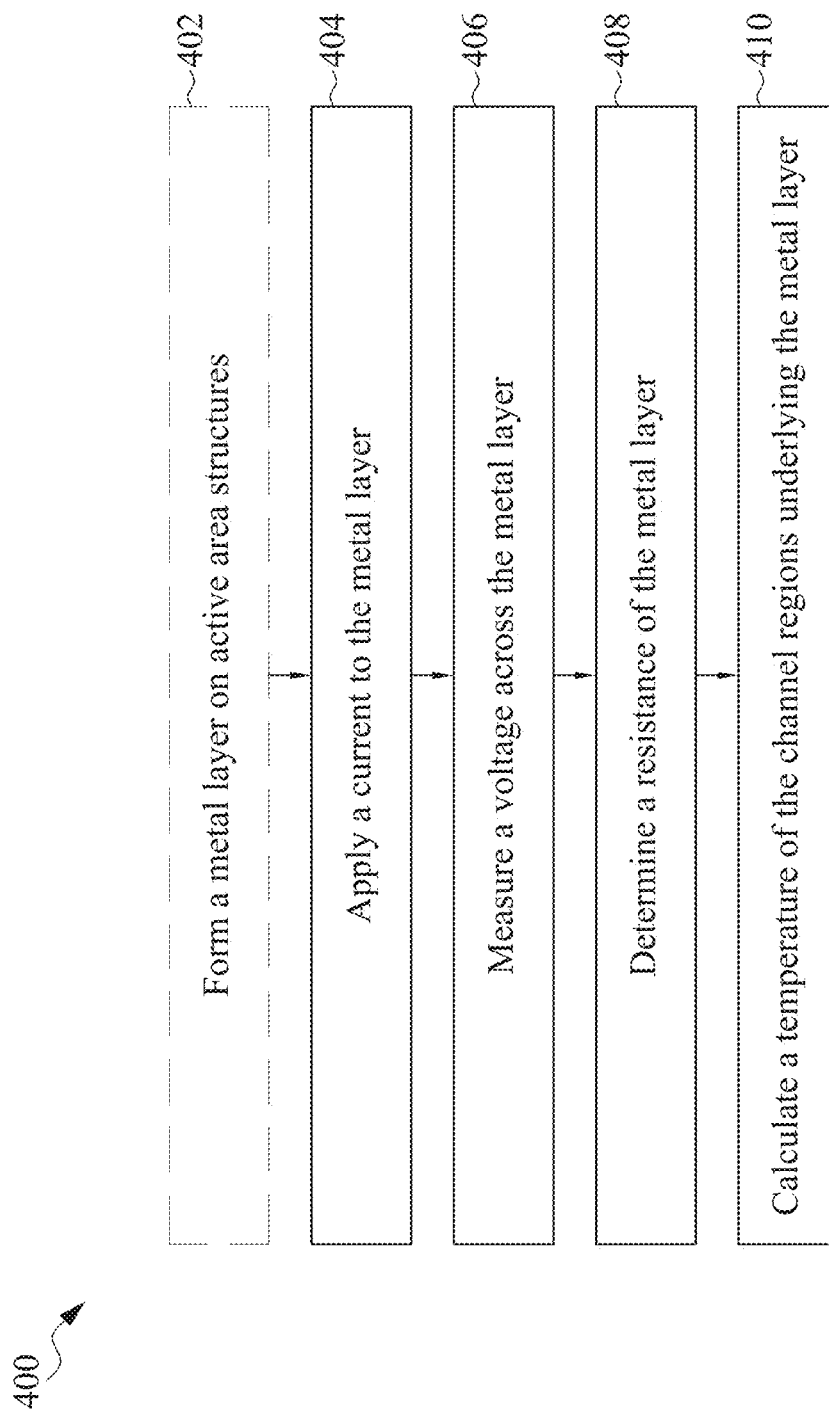
FIG. 4 is a flowchart of a method of measuring temperature, in accordance with one or more embodiments.

FIG. 4 is a flowchart of a method 400 of measuring a temperature of a channel region, in accordance with one or more embodiments. In various embodiments, the method 400 is useable for measuring the temperature of channel regions of active area structures shared by one or more active devices or configured to emulate operation of one or more active devices.

In operation 402, in some embodiments, a metal layer, such as the sense metal resistor 120 (FIG. 1A) or the sense gate layer 214 (FIG. 2A), is formed on active area structures, such as active area structures 102, 103, 104, 105, and 106 (FIG. 1A), active area structures 202, 203, 204, 205, and 206 (FIG. 2A), or active area structures 302, 304, 306, 308 and 310. In some embodiments, the metal layer is an overlay metal layer. In some embodiments, the metal layer is a polysilicon or metal gate layer. In some embodiments, the metal layer is a drain metal layer. In some embodiments, the metal layer is a source metal layer.

In operation 404, a current is applied to the metal layer, such as the sense metal resistor 120 (FIG. 1A) or the sense gate layer 214 (FIG. 2A). In some embodiments, applying the current to the metal layer includes providing the current to the metal layer through a pair of vias, such as the vias 144 and 146 (FIG. 1A) or the vias 228 and 230 (FIG. 2A).

Applying the current includes applying a DC current as discussed above with respect to FIGS. 1A-3. In some embodiments, applying the current includes applying the DC current to a first gate layer of a first active device of a cascode arrangement, and applying an AC and/or transient signal to a second gate layer of a second active device of the cascode arrangement, as discussed above with respect to FIGS. 2A-3.

In operation 406, the voltage across the metal layer, such as the sense metal resistor 120 (FIG. 1A) or the sense gate layer 214 (FIG. 2A) is measured, such as by a readout circuit (FIG. 1A). In some embodiments, the readout circuit is configured to measure the voltage across the aforementioned metal layer. In some embodiments, the readout circuit is a resistive readout circuit. In some embodiments, the readout circuit is a 4-point Kelvin structure having a double bridge configuration to measure resistance levels below 1 ohm. In some embodiments, the readout circuit includes an analog to digital converter. In some embodiments, the readout circuit includes an operational amplifier.

In some embodiments, measuring the voltage across the metal layer includes measuring the voltage through a pair of vias, such as the vias 144 and 146 (FIG. 1A) or the vias 228 and 230 (FIG. 2A).

In operation 408, the resistance of the metal layer, such as the sense metal resistor 120 (FIG. 1A) or the sense gate metal layer 214 (FIG. 2A) is determined using the measured voltage across the metal layer and the current applied to the metal layer, as discussed above with respect to FIGS. 1A-3.

In operation 410, the temperature of the channel regions of the active area structures underlying the metal layer, such as the sense metal resistor 120 (FIG. 1A) or the sense polysilicon gate metal layer 214 (FIG. 2A) is calculated using the linear relationship between the temperature and the resistance of the aforementioned metal layer, as discussed above with respect to FIGS. 1A-3. In some embodiments, calculating the temperature of the channel regions includes calculating the channel regions of the active area structures being shared by multiple active devices. In some embodiments, calculating the temperature includes calculating the transient temperature change of an active device under an AC or DC operation. In some embodiments, calculating the temperature includes calculating the temperature of a substrate when all active devices disposed on the active area structures are OFF.

In some embodiments, a semiconductor device includes: a plurality of active area structures; one or more active devices including portions of the plurality of active area structures; and a metal layer overlying the plurality of active area structures and separated from the one or more active devices by one or more dummy gate layers, wherein the metal layer is configured to measure, due to a change of resistance in the metal layer, a temperature of the plurality of active area structures. In some embodiments, the plurality of active area structures include fins of a FinFET. In some embodiments, the plurality of active area structures include channels of a GAA FET. In some embodiments, the metal layer includes nichrome, carbon, a metal oxide, or Cu. In some embodiments, the semiconductor device further includes a pair of vias at opposite ends of the metal layer, whereby the metal layer is configured to receive a current. In some embodiments, the metal layer is thereby configured to have a voltage drop between the pair of vias in response to the current. In some embodiments, a resistance of the metal layer is linearly proportional to the temperature of the plurality of active area structures. In some embodiments, at least one of the one or more active devices is a 3D active device. In some embodiments, the metal layer includes a drain metal layer formed on the plurality of active area structures. In some embodiments, the one or more active devices are configured to be turned OFF while measuring a temperature of a substrate includes the plurality of active area structures.

In some embodiments, a semiconductor device includes: a plurality of active area structures; one or more active devices including portions of the plurality of active area structures; a first dummy gate layer; a second dummy gate layer; and a metal layer overlying the plurality of active area structures and positioned between the first dummy gate layer and the second dummy gate layer to electrically isolate the metal layer from the one or more active devices, wherein the metal layer is configured to measure, due to a change of resistance in the metal layer, a temperature of the plurality of active area structures. In some embodiments, the plurality of active area structures include fins of a FinFET. In some embodiments, the plurality of active area structures include channels of a GAA FET. In some embodiments, the metal layer includes nichrome, carbon, a metal oxide, or Cu. In some embodiments, the semiconductor device further includes a pair of vias at opposite ends of the metal layer, whereby the metal layer is configured to receive a current.

In some embodiments, a semiconductor device includes: a plurality of active area structures; a first active device and a second active device including portions of the plurality of active area structures, wherein the first active device and the second active device are arranged in a cascode configuration; a first dummy gate layer; a second dummy gate layer, wherein the first dummy gate layer and the second dummy gate layer are positioned between the first active device and the second active device; and a metal layer overlying the plurality of active area structures and positioned between the first dummy gate layer and the second dummy gate layer, wherein the metal layer is configured to measure, due to a change of resistance in the metal layer, a temperature of the plurality of active area structures. In some embodiments, the plurality of active area structures include fins of a FinFET. In some embodiments, the plurality of active area structures include channels of a GAA FET. In some embodiments, the metal layer includes nichrome, carbon, a metal oxide, or Cu. In some embodiments, the semiconductor device further includes a pair of vias at opposite ends of the metal layer, whereby the metal layer is configured to receive a current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a plurality of active area structures;
   one or more active devices including portions of the plurality of active area structures; and
   a metal layer overlying the plurality of active area structures and separated from the one or more active devices by one or more dummy gate layers, wherein the metal layer is configured to measure, due to a change of resistance in the metal layer, a temperature of the plurality of active area structures.

2. The semiconductor device of claim 1, wherein the plurality of active area structures comprise fins of a fin field-effect transistor (FinFET).

3. The semiconductor device of claim 1, wherein the plurality of active area structures comprise channels of a gate-all-around (GAA) field-effect transistor (FET).

4. The semiconductor device of claim 1, wherein the metal layer comprises nichrome, carbon, a metal oxide, or copper (Cu).

5. The semiconductor device of claim 1, further comprising a pair of vias at opposite ends of the metal layer, whereby the metal layer is configured to receive a current.

6. The semiconductor device of claim 5, wherein the metal layer is thereby configured to have a voltage drop between the pair of vias in response to the current.

7. The semiconductor device of claim 1, wherein a resistance of the metal layer is linearly proportional to the temperature of the plurality of active area structures.

8. The semiconductor device of claim 1, wherein at least one of the one or more active devices is a three dimensional (3D) active device.

9. The semiconductor device of claim 1, wherein the metal layer comprises a drain metal layer formed on the plurality of active area structures.

10. The semiconductor device of claim 1, wherein the one or more active devices are configured to be turned OFF while measuring a temperature of a substrate comprising the plurality of active area structures.

11. A semiconductor device comprising:
    a plurality of active area structures;
    one or more active devices including portions of the plurality of active area structures;
    a first dummy gate layer;
    a second dummy gate layer; and
    a metal layer overlying the plurality of active area structures, positioned between the first dummy gate layer and the second dummy gate layer, and electrically isolated from the one or more active devices, wherein the metal layer is configured to measure, due to a change of resistance in the metal layer, a temperature of the plurality of active area structures.

12. The semiconductor device of claim 11, wherein the plurality of active area structures comprise fins of a fin field-effect transistor (FinFET).

13. The semiconductor device of claim 11, wherein the plurality of active area structures comprise channels of a gate-all-around (GAA) field-effect transistor (FET).

14. The semiconductor device of claim 11, wherein the metal layer comprises nichrome, carbon, a metal oxide, or copper (Cu).

15. The semiconductor device of claim 11, further comprising a pair of vias at opposite ends of the metal layer, whereby the metal layer is configured to receive a current.

16. A semiconductor device comprising:
    a plurality of active area structures;
    a first active device and a second active device including portions of the plurality of active area structures, wherein the first active device and the second active device are arranged in a cascode configuration;
    a first dummy gate layer;
    a second dummy gate layer, wherein the first dummy gate layer and the second dummy gate layer are positioned between the first active device and the second active device; and
    a metal layer overlying the plurality of active area structures and positioned between the first dummy gate layer and the second dummy gate layer, wherein the metal layer is configured to measure, due to a change of resistance in the metal layer, a temperature of the plurality of active area structures.

17. The semiconductor device of claim 16, wherein the plurality of active area structures comprise fins of a fin field-effect transistor (FinFET).

18. The semiconductor device of claim 16, wherein the plurality of active area structures comprise channels of a gate-all-around (GAA) field-effect transistor (FET).

19. The semiconductor device of claim 16, wherein the metal layer comprises nichrome, carbon, a metal oxide, or copper (Cu).

20. The semiconductor device of claim 16, further comprising a pair of vias at opposite ends of the metal layer, whereby the metal layer is configured to receive a current.

* * * * *